United States Patent
Adkisson et al.

(10) Patent No.: US 8,673,683 B2
(45) Date of Patent: Mar. 18, 2014

(54) GRAPHENE FIELD EFFECT TRANSISTOR

(75) Inventors: James W. Adkisson, Jericho, VT (US); Thomas J. Dunbar, Burlington, VT (US); Jeffrey P. Gambino, Westford, VT (US); Molly J. Leitch, Rocky River, OH (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/492,131

(22) Filed: Jun. 8, 2012

(65) Prior Publication Data

US 2013/0146847 A1    Jun. 13, 2013

Related U.S. Application Data

(63) Continuation-in-part of application No. 13/324,246, filed on Dec. 13, 2011.

(51) Int. Cl.
*H01L 51/40*    (2006.01)
*H01L 21/8232*  (2006.01)
*H01L 21/336*   (2006.01)

(52) U.S. Cl.
USPC ............. 438/99; 438/142; 438/197; 438/294; 257/E21.001

(58) Field of Classification Search
USPC .......... 438/142, 149, 197; 257/E51.038, 213, 257/288; 700/755
See application file for complete search history.

(56) References Cited

U.S. PATENT DOCUMENTS

| | | | |
|---|---|---|---|
| 4,760,036 A | 7/1988 | Shubert | |
| 5,231,037 A | 7/1993 | Yuan et al. | |
| 5,723,370 A | 3/1998 | Ning et al. | |
| 5,793,082 A | 8/1998 | Bryant | |
| 6,223,813 B1 | 5/2001 | Chrysler et al. | |
| 7,732,859 B2 | 6/2010 | Anderson et al. | |
| 7,851,309 B2 | 12/2010 | Leslie | |
| 7,960,713 B2 | 6/2011 | Hunt et al. | |
| 8,310,015 B2 * | 11/2012 | Segal et al. | 257/415 |
| 8,358,008 B2 | 1/2013 | Wada et al. | |
| 2005/0035390 A1 | 2/2005 | Beroz | |
| 2005/0212014 A1 * | 9/2005 | Horibe et al. | 257/213 |
| 2006/0202239 A1 | 9/2006 | Holmes et al. | |
| 2007/0053168 A1 | 3/2007 | Sayir et al. | |
| 2007/0059891 A1 | 3/2007 | Furukawa et al. | |
| 2008/0170982 A1 | 7/2008 | Zhang et al. | |

(Continued)

FOREIGN PATENT DOCUMENTS

| | | |
|---|---|---|
| JP | 2002110977 | 4/2002 |
| WO | WO2012017533 | * 2/2012 |

OTHER PUBLICATIONS

Lin, Y. et al., "Progress and Future of Carbon-Based Electronics", IEEE, 2008, 2 pages.

(Continued)

*Primary Examiner* — Seahvosh Nikmanesh
*Assistant Examiner* — Evren Seven
(74) *Attorney, Agent, or Firm* — Michael LeStrange; Roberts Mlotkowski Safran & Cole, P.C.

(57) ABSTRACT

Manufacturing a semiconductor structure including: forming a seed material on an insulator layer; forming a graphene field effect transistor (FET) on the seed material; and forming an air gap under the graphene FET by removing the seed material.

19 Claims, 14 Drawing Sheets

(56) References Cited

U.S. PATENT DOCUMENTS

| | | | |
|---|---|---|---|
| 2009/0020764 A1 | 1/2009 | Anderson et al. | |
| 2010/0003462 A1 | 1/2010 | Kamins et al. | |
| 2010/0006823 A1 | 1/2010 | Anderson et al. | |
| 2010/0200840 A1 | 8/2010 | Anderson et al. | |
| 2010/0214012 A1 | 8/2010 | Raza | |
| 2010/0224851 A1 | 9/2010 | Colombo et al. | |
| 2010/0258757 A1 | 10/2010 | Chae et al. | |
| 2011/0042649 A1 | 2/2011 | Duvall et al. | |
| 2011/0057251 A1 | 3/2011 | Higashi | |
| 2011/0059599 A1* | 3/2011 | Ward et al. | 438/507 |
| 2011/0114919 A1 | 5/2011 | Jenkins et al. | |
| 2011/0220865 A1 | 9/2011 | Miyata et al. | |
| 2011/0253983 A1 | 10/2011 | Chen et al. | |
| 2011/0278545 A1* | 11/2011 | Voutilainen et al. | 257/29 |
| 2011/0284818 A1 | 11/2011 | Avouris et al. | |
| 2012/0049160 A1* | 3/2012 | Sano et al. | 257/27 |
| 2012/0074387 A1 | 3/2012 | King | |
| 2012/0086132 A1 | 4/2012 | Kim et al. | |
| 2012/0132357 A1* | 5/2012 | Shin et al. | 156/281 |
| 2012/0138902 A1 | 6/2012 | Hunt et al. | |
| 2012/0199815 A1* | 8/2012 | Kondo et al. | 257/29 |
| 2012/0205653 A1 | 8/2012 | Nishikage et al. | |
| 2012/0256167 A1 | 10/2012 | Heo et al. | |
| 2012/0267041 A1* | 10/2012 | Woo et al. | 156/230 |
| 2013/0009133 A1* | 1/2013 | Avouris et al. | 257/29 |
| 2013/0022811 A1* | 1/2013 | Ahn et al. | 428/336 |

OTHER PUBLICATIONS

Kedzierski, J. et al., "Graphene-on-Insulator Transistors Made Using C on Ni Chemical-Vapor Deposition", IEEE Electron Device Letters, vol. 30, No. 7, Jul. 2009, pp. 745-747.

Gomez De Arco, L. et al., "Synthesis, Transfer, and Devices of Single- and Few-Layer Graphene by Chemical Vapor Deposition", IEEE Transactions on Nanotechnology, vol. 8, No. 2, Mar. 2009, pp. 135-138.

Farmer, D. et al., "Behavior of a chemically doped graphene junction", Applied Physics Letters 94, American Institue of Physics, 2009, pp. 1-3.

Lin, Y. et al., "Dual-Gate Graphene FETs With fT of 50 GHz", IEEE Electron Device Letters, vol. 31, No. 1, Jan. 2010, pp. 68-70.

Jung, M. et al., "Polymer Material as a Gate Dielectric for Graphene Field-Effect-Transistor Applications", Japanese Journal of Applied Physics 50, The Japan Society of Applied Physics, 2011, pp. 1-5.

Avouris, P. et al., "Graphene-based fast electronics and optoelectronics", IEEE, 2010, pp. 1-4.

Liu, W. et al., "Chemical vapor deposition of large area few layer graphene on Si catalyzed with nickel films", Thin Solid Films, Elsevier, 2010, pp. 128-132.

"Microtechnology/Etching Processes", http://en.wikibooks/wiki/Microtechnology/Etching_Processes, Wikibooks, Aug. 10, 2011, pp. 1-15.

Reina, A. et al., "Large Area, Few-Layer Graphene Films on Arbitrary Substrates by Chemical Vapor Deposition", Nano Letters, American Chemical Society, 2009, vol. 9, No. 1, 7 pages.

ASM International, Graphene Grains Make Atom-Thick Patchwork 'Quilts', http://www.asminternational.org/portal/site/www/NewsItemPrint/?vgnextoid=711d81b9f1a9d210VgnVCM100000621e010aRCRD, Jan. 18, 2011, 2 pages.

International Search Report for PCT Application No. PCT/US2012/063508, dated Jan. 31, 2013, 4 pages.

Written Opinion of the International Searching Authority for PCT Application No. PCT/US2012/063508, dated Jan. 31, 2013, 5 pages.

Office Action dated Feb. 12, 2013 for U.S. Appl. No. 13/324,246; 9 pages.

Final Office Action dated Jun. 5, 2013, 2013 for U.S. Appl. No. 13/324,246; 10 pages.

Notice of allowance dated Sep. 10, 2013 for U.S. Appl. No. 13/324,246; 8 pages.

* cited by examiner

_US 8,673,683 B2_

GRAPHENE FIELD EFFECT TRANSISTOR

CROSS-REFERENCE TO RELATED APPLICATIONS

This application is a continuation-in-part of U.S. application Ser. No. 13/324,246, filed on Dec. 13, 2011, the contents of which are incorporated by reference herein in their entirety.

FIELD OF THE INVENTION

The invention relates to semiconductor structures and methods of manufacture and, more particularly, to a graphene field effect transistor (FET).

BACKGROUND

In the last few decades, the semiconductor industry has been able to maintain steady improvements of device performance by the scaling of silicon-based devices. However, it is believed this approach will soon meet both scientific and technical limits, and there have been tremendous efforts to seek alternative device technologies. One such alternative is the use of graphene in semiconductor structures.

Graphene is a layer of carbon atoms bonded in a honeycomb crystal lattice. Graphene has a high carrier mobility, as well as low noise, allowing it to be used as a substitute for silicon in the channel in a FET. Intrinsic graphene is a semi-metal or zero-gap semiconductor, with an E-k relation that is linear at low energies near the six corners of the two-dimensional hexagonal Brillouin zone, leading to zero effective mass for electrons and holes. Graphene has high electron mobility at room temperature, with reported values of 15,000 $cm^2V^{-1}s^{-1}$. Moreover, graphene resistivity is very low, e.g., less than the resistivity of silver, which is the lowest resistivity substance currently known at room temperature. Measurements have shown that graphene has a breaking strength 200 times greater than steel, with a tensile strength of 130 GPa. Additionally, graphene has thermal properties comparable to diamond for basal plane thermal conductivity. As for optical properties, graphene can be saturated readily under strong excitation over the visible to near-infrared region, due to the universal optical absorption and zero band gap, which permits application in ultrafast photonics.

Accordingly, there exists a need in the art to overcome the deficiencies and limitations described hereinabove.

SUMMARY

In a first aspect of the invention, a method of manufacturing a semiconductor structure includes forming a seed material on an insulator layer. The method also includes forming a graphene field effect transistor (FET) on the seed material. The method also includes forming an air gap under the graphene FET by removing the seed material.

In another aspect of the invention, a method of forming a semiconductor structure includes forming an insulator layer on a substrate, forming a seed material on the insulator layer, and forming a graphene layer on the seed material. The method also includes forming a gate dielectric on the graphene layer. The method also includes forming a source electrode and a drain electrode on the graphene layer. The method also includes forming a gate electrode on the gate dielectric and between the source electrode and the drain electrode. The method also includes forming an upper insulator layer on the gate electrode, the source electrode, and the drain electrode. The method also includes exposing a portion of the seed material by forming a vent hole in the upper insulator layer and the graphene layer. The method also includes removing the seed material through the vent hole. The method also includes plugging the vent hole.

In yet another aspect of the invention, a graphene field effect transistor (FET) includes a substantially planar and horizontally oriented graphene layer that functions as a source, a drain, and a channel region of the FET. The graphene field effect transistor (FET) also includes an air gap directly under the graphene layer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to a graphene field effect transistor (FET). According to aspects of the invention, graphene that functions as a channel in a FET is grown on a sacrificial material that is arranged on sidewalls of a mandrel. In embodiments, source/drain electrodes, a gate dielectric, and a gate electrode are formed on the graphene, and the sacrificial material is subsequently removed. In this manner, a vertical graphene FET is formed at the wafer level without using transfer processes.

Graphene is currently being used in field effect transistors (FETs) and integrated circuits (ICs). However, single sheets of graphene are difficult to produce, and more difficult to form on an appropriate substrate. For example, graphene is typically utilized by growing the graphene on a first substrate and then transferring the graphene to a second substrate, e.g., referred to as exfoliation, transfer, etc. Such transferring processes involve numerous manufacturing steps and results in high cost and low yield.

Figure 1:
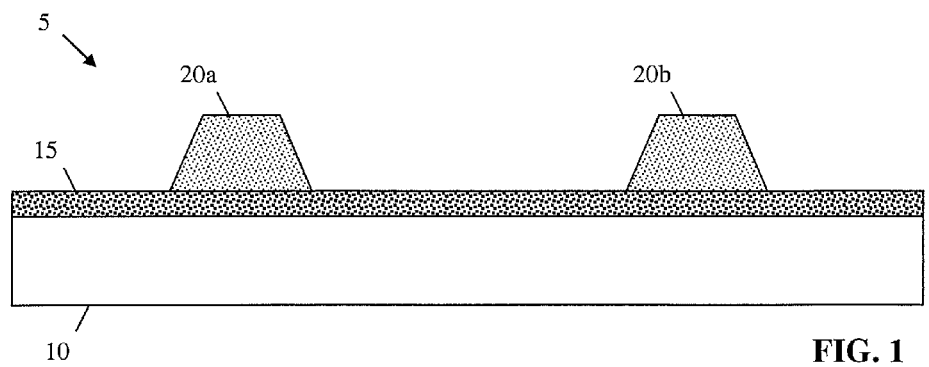
FIGS. 1-17 show processing steps and structures in accordance with aspects of the invention.

FIGS. 1-17 show processing steps and structures in accordance with aspects of the invention. In particular, FIG. 1 shows a cross section of a portion of a semiconductor structure 5 that has undergone CMOS processing. The semiconductor structure 5 may comprise a substrate 10. The substrate 10 may be composed of any suitable material or combination of materials, such as doped or undoped silicon, glass, etc. For example, the substrate may comprise a semiconductor-on-insulator (SOI), e.g., with a buried insulator layer, or a bulk material substrate, e.g., with appropriately doped regions typically referred to as wells.

In embodiments, an insulator layer 15 is formed on the substrate 10. The insulator layer 15 may comprise any suitable electrical insulator material, such as SiN, etc., and may be formed using conventional semiconductor processing techniques, such as chemical vapor deposition (CVD), etc.

Still referring to FIG. 1, at least one mandrel 20a, 20b, etc., is formed on the insulator layer 15. Although two mandrels 20a and 20b are shown in FIG. 1, it is understood that any number of mandrels may be used within the scope of the invention. Each mandrel 20a and 20b comprises an electrical insulator material having first and second sidewalls that are arranged at an angle (e.g., an acute and/or non-zero angle) relative to the upper surface of the substrate 10. The first and second sidewalls may be arranged at different angles relative to the upper surface of the substrate 10. For example, each mandrel 20a and 20b may have a substantially trapezoidal shape in cross section. In embodiments, the mandrels 20a and 20b comprise SiO$_2$, although any suitable insulator material can be used within the scope of the invention. The mandrels 20a and 20b may be formed using conventional semiconductor processing techniques, such as deposition, masking, and etching.

For example, any desired number of mandrels may be simultaneously formed by first forming a layer of mandrel material, e.g., a layer of SiO$_2$ formed using CVD, on the insulator layer 15. Then a photomask may be provided by forming a layer of photoresist material on the layer of mandrel material, exposing the photoresist material to a pattern of light, and developing the exposed photoresist material. An etching process, such as a reactive ion etch (RIE), may then be used to form patterns (e.g., openings) in the layer of mandrel material by removing portions of the layer of mandrel material that are not covered by the photomask. After etching, the photomask may be removed using a conventional ashing or stripping process. The un-etched portions of the layer of mandrel material that remain after the masking and etching form the mandrels 20a and 20b. The mandrels 20a and 20b may be provided with angled sidewalls, e.g., a substantially trapezoidal shape, by using a tapered resist profile, e.g., with a half-tone mask, or by intentionally eroding portions of the resist prior to or during the etching step.

Figure 2:
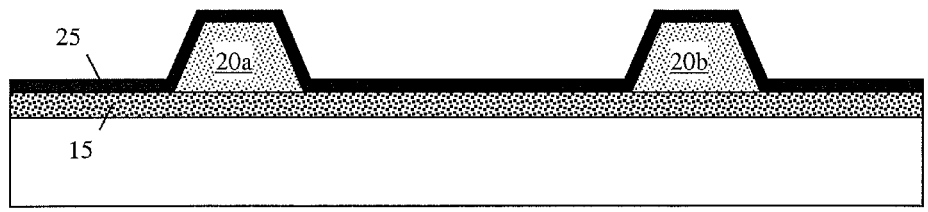

As shown in FIG. 2, a sacrificial seed material 25 is formed on the upper surfaces of the insulator layer 15 and mandrels 20a and 20b. According to aspects of the invention, the sacrificial seed material 25 is used as a seed material for forming graphene, as described in greater detail herein. In embodiments, the sacrificial seed material 25 comprises a layer of Ni (nickel) that is about 10 nm to about 500 nm thick and is formed using a sputtering process, although other suitable materials, thicknesses, and/or deposition processes may be used within the scope of the invention.

Figure 3:
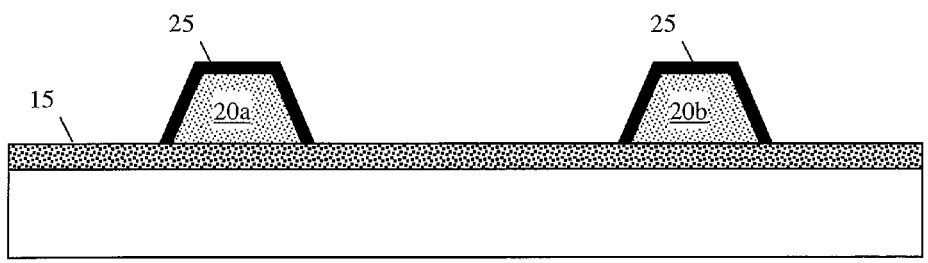

As shown in FIG. 3, the sacrificial seed material 25 is patterned such that the sacrificial seed material 25 does not extend continuously from one mandrel 20a to another mandrel 20b. The sacrificial seed material 25 may be patterned in any desired manner, such as using photolithographic masking and etching. In embodiments, the sacrificial seed material 25 remains on the mandrels 20a and 20b after patterning.

Figure 4:
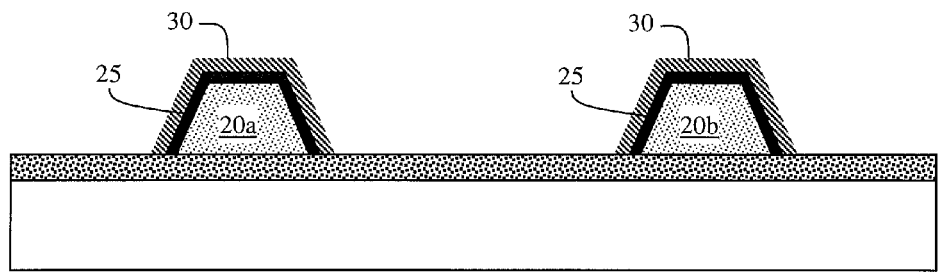

FIG. 4 shows the formation of graphene 30 on the sacrificial seed material 25 on the mandrels 20a and 20b. In embodiments, the sacrificial seed material 25 comprises Ni and the graphene 30 is grown with a CVD process. For example, a single layer of graphene may be formed on Ni using a CVD process with a flow of methane ($CH_4$), argon (Ar), and hydrogen ($H_2$) gases at temperatures from about 900° C. to about 1000° C. for growth times of about 50 s to about 120 s, and post-growth cooling with a flow of Ar and $H_2$ at a cooling rate in a range of about 7° C./min to about 25° C./min. It is to be understood, however, that any suitable method may be used to form the graphene 30 on the sacrificial seed material 25.

Since the sacrificial seed material 25 is formed on the angled sidewalls of the mandrels 20a and 20b, and the graphene 30 is formed on the sacrificial seed material 25, the graphene 30 is provided with a shape similar to the perimeter of the mandrels 20a and 20b. For example, as shown in FIG. 4, the graphene 30 on each respective mandrel 20a and 20b has a first portion arranged at a first angle relative to an upper surface of a substrate, a second portion arranged at a second angle relative to the upper surface of the substrate, and a third portion arranged between the first portion and the second portion, wherein the first angle is different than the second angle.

Figure 5:
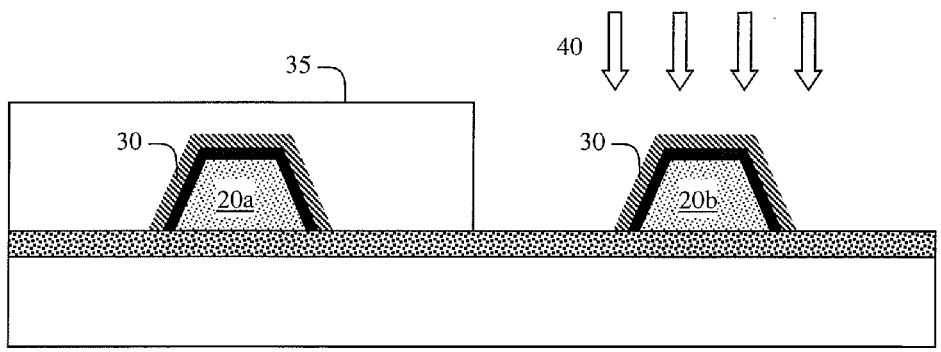
Figure 6:
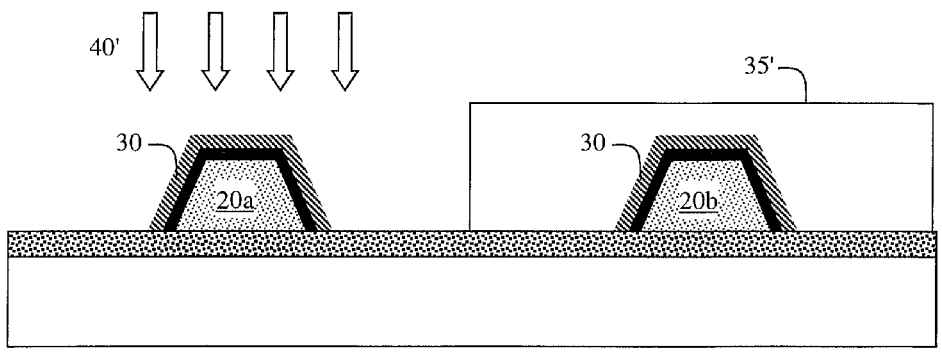

FIGS. 5 and 6 show optional doping of the graphene 30 on the respective mandrels 20a and 20b. For example, as shown in FIG. 5, a mask 35 may be formed over the first mandrel 20a and associated graphene 30, leaving the second mandrel 20b and its associated graphene 30 exposed. The mask 35 may comprise a photomask or hard mask formed using conventional semiconductor processing techniques, e.g., photolithography. After forming the mask 35, the graphene 30 on the second mandrel 20b may be doped with n-type or p-type dopant using any suitable doping technique, represented by arrows 40. For example, for n-type doping, the graphene 30 on the second mandrel 20b may be chemically doped by exposure to a solution containing poyethylene imine (PEI) for a sufficient amount of time to permit PEI molecules to adsorb into the graphene 30. Alternatively, for p-type doping, the graphene 30 on the second mandrel 20b may be chemically doped by exposure to diazonium salts that bind to the graphene surface. The mask 35 is removed after doping the graphene 30 on the second mandrel 20b.

FIG. 6 shows forming a second mask 35' over the second mandrel 20b and its associated graphene 30, leaving the first mandrel 20a and its associated graphene 30 exposed. A second doping depicted by arrows 40' may be performed in a manner similar to that described above with respect to FIG. 5. The mask 35' is removed after the second doping. For example, FIG. 5 may represent an n-type doping of the graphene 30 on the second mandrel 20b and FIG. 6 may represent a p-type doping of the graphene 30 on the first mandrel 20a, or vice versa.

Figure 7:
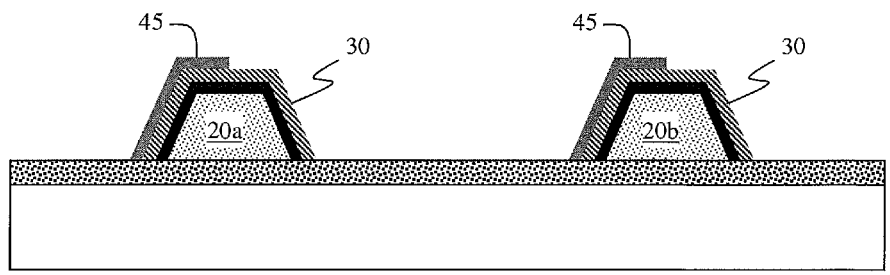

As show in FIG. 7, source/drain electrodes 45 are formed on the graphene 30 on the mandrels 20a and 20b. The source/drain electrodes 45 are electrically conductive and may be composed of any suitable material or combination of materials. For example, each source/drain electrode 45 may comprise a layer of palladium (Pd) having a thickness of about 20 nm and a layer of gold (Au) having a thickness of about 40 nm. As another example, each source/drain electrode 45 may comprise a layer of titanium (Ti) having a thickness of about 20 nm and a layer of gold (Au) having a thickness of about 50 nm. The source/drain electrodes 45 may be formed using conventional semiconductor processing techniques, such as electron beam evaporation combined with a lift-off process. It is to be understood that other materials, thicknesses, and/or deposition processes may be used for the source/drain electrodes 45.

Figure 8:
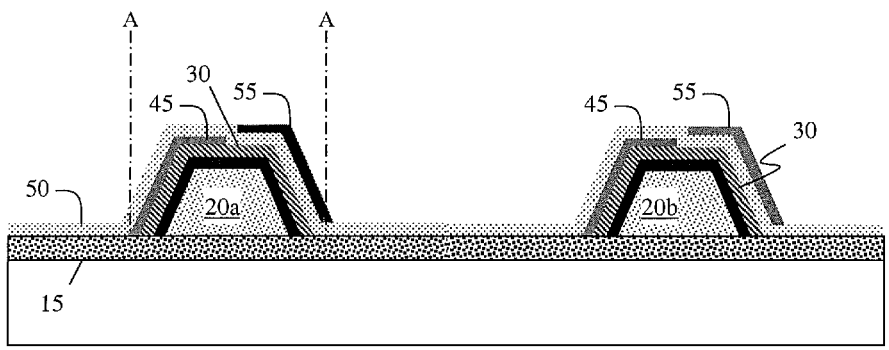

As shown in FIG. 8, a gate dielectric 50 is formed on exposed surfaces of the insulator layer 15, graphene 30, and source/drain electrodes 45. The gate dielectric 50 may comprise any suitable material including, but not limited to, $Al_2O_3$, $HfO_2$, SiN, polymer (e.g., NFC, ZEP520a, etc.), and combinations thereof. The gate dielectric 50 may be formed using conventional semiconductor processing techniques including, but not limited to, atomic layer deposition (ALD), e.g., for $Al_2O_3$ and/or $HfO_2$, plasma enhanced chemical vapor deposition (PECVD), e.g., for SiN, and spin-coating, e.g., for polymers. The gate dielectric 50 may have a physical thickness of about 10 nm to about 20 nm, although other thicknesses, materials, and/or formation processes may be used within the scope of the invention.

Still referring to FIG. 8, gate electrodes 55 are formed on the gate dielectric 50 on the mandrels 20a and 20b. The gate electrodes 55 are electrically conductive and may be composed of any suitable material or combination of materials. For example, each gate electrode 55 may comprise platinum (Pt), aluminum (Al), titanium (Ti), and/or gold (Au). The gate electrodes 55 may be formed using conventional semiconductor processing techniques, such as electron beam evaporation combined with a lift-off process. The gate electrodes 55 are not limited to the materials and processes described herein, and other materials and/or formation processes may be used within the scope of the invention.

Figure 9:
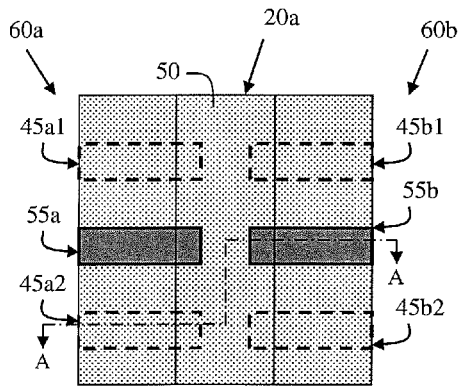

FIG. 9 shows a top (e.g., plan) view of the mandrel 20a at section A-A of FIG. 8. As depicted in FIGS. 8 and 9, the source/drain electrodes 45 are directly on the graphene 30 and covered with the gate dielectric 50, and the gate contacts 55 are directly on the gate dielectric 50. FIG. 9 shows a first FET 60a comprising source electrode 45a1, drain electrode 45a2, and gate electrode 55a on a first side of the mandrel 20a. On the other side of the same mandrel 20a, a second FET 60b comprises source electrode 45b1, drain electrode 45b2, and gate electrode 55b.

As depicted in FIGS. 8 and 9, the graphene 30 serves as a channel between the source electrode 45a1 and drain electrode 45a2, as well as between source electrode 45b1 and drain electrode 45b2. In this manner, first and second graphene FETs 60a and 60b are provided. Moreover, the FETs 60a and 60b are vertical transistors in the sense that the components (e.g., source, drain, channel, etc.) are built upward from the horizontal top plane of the substrate, rather than being horizontally planar on the top plane of the substrate. In this manner, more transistors may be provided in a given footprint on the substrate. Mandrel 20b may have a similar arrangement of vertical graphene FETs.

Figure 10:
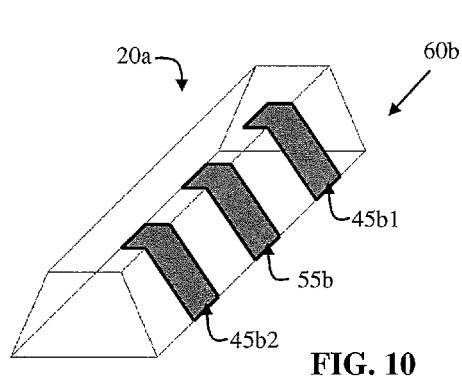

FIG. 10 shows a perspective diagrammatic view of the second FET 60b comprising source electrode 45b1, drain electrode 45b2, and gate electrode 55b arranged on the mandrel 20a. For clarity, the gate dielectric and graphene are not shown in FIG. 10.

Figure 11:
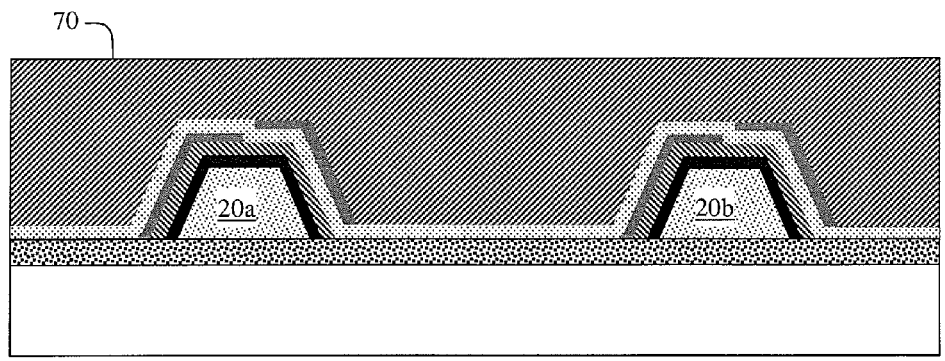

As shown in FIG. 11, an insulator layer 70 is formed over the entire structure. The insulator layer 70 may comprise any suitable electrical insulator material, such as, for example, borophosphosilicate glass (BPSG), tetraethylorthosilicate (TEOS), phosphosilicate glass (PSG), etc. The insulator layer 70 may be formed using conventional semiconductor manufacturing processes, such as CVD.

Figure 12:
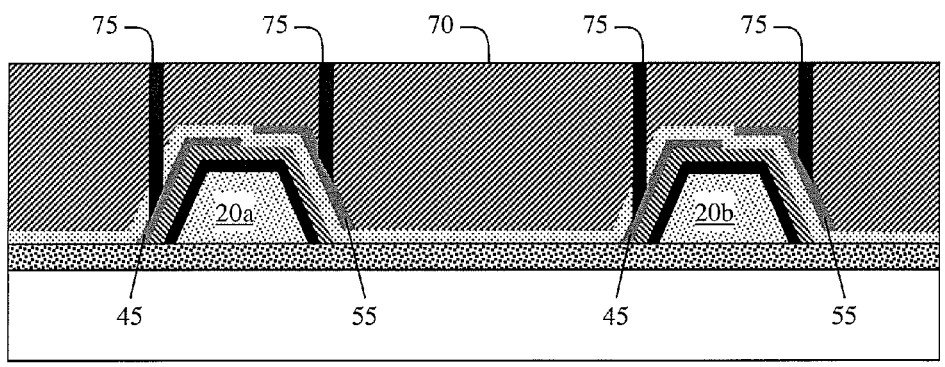

As shown in FIG. 12, electrical contacts 75 are formed in the insulator layer 70 and contacting the source/drain electrodes 45 and gate electrodes 55. The contacts 75 may be any suitable electrically conductive material including, but not limited to, tungsten (W). The contacts 75 may be formed using conventional processing techniques, such as masking the insulator layer 70, etching patterns in the insulator layer 70, filling the patterns with the electrically conductive material, and planarizing the top surface.

For example, as is understood by those of ordinary skill in the art, a photomask may provided by forming a layer of photoresist material on the insulator layer 70, exposing the photoresist material to a pattern of light, and developing the exposed photoresist material. An etching process, such as a reactive ion etch (RIE), may then be used to form patterns (e.g., openings) in the insulator layer 70 by removing portions of the insulator layer 70 that are not covered by the photomask. The etch process may also remove portions of the gate dielectric 50 for exposing the source/drain electrodes 45. After etching, the photomask may be removed using a conventional ashing or stripping process. A deposition process, such as chemical vapor deposition (CVD) or atomic layer deposition (ALD), may then be used to fill the patterns (openings) with electrically conductive material including, e.g., tungsten (W). A liner material, such as Ti, TiN, etc., may be formed as a thin film on the walls of the patterns (openings) prior to filling the patterns (openings) with the conductive material. A planarization process, such as chemical mechanical polish (CMP), may be used to remove material from the top surface of the structure to form a substantially planar uppermost surface.

Figure 13:
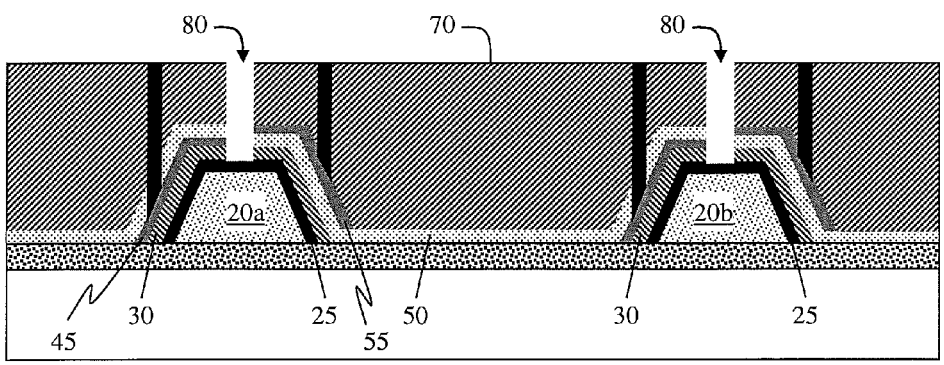

As shown in FIG. 13, vent holes 80 are formed through the insulator layer 70, gate dielectric 50, and graphene 30 to expose a portion of the sacrificial seed material 25. The vent holes 80 may be formed using conventional lithographic masking and etching processes. In embodiments, each vent hole 80 extends completely through a depth of the graphene 30 as well as along an entire length of the graphene 30 across the upper (e.g., horizontal) surface of the mandrel, such that the graphene 30 on each mandrel is divided (e.g., bisected) into discrete sections, e.g., one discrete section for each respective FET (e.g., FETs 60a and 60b shown in FIG. 9) on each mandrel. For example, each vent hole 80 may comprise a rectangular slot that extends across the entire top surface of the mandrel. By forming the vent hole 80 through the entire length and depth of the graphene along the top of the mandrel, the two FETs on either side of the mandrel are electrically isolated from one another. In additional embodiments, the vent hole 80 abuts against or extends into the source/drain electrodes 45 and gate electrodes 55. In this manner, in each FET (e.g., FET 60a and 60b shown in FIG. 9), an electrical path through the graphene from the source electrode to the drain electrode necessarily passes under the gate electrode.

Figure 14:
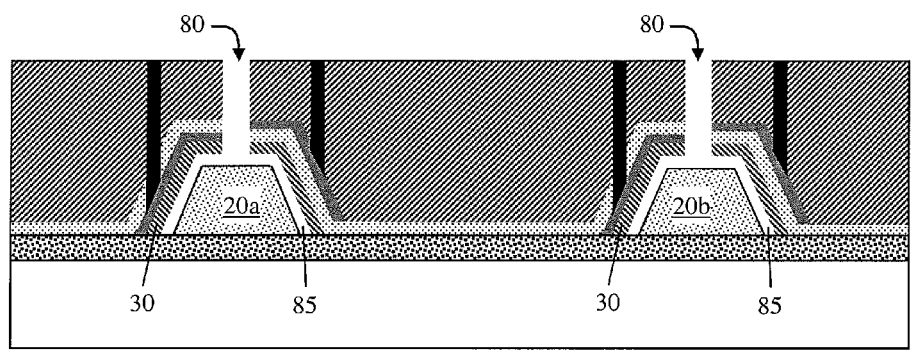

FIG. 14 shows the removal of the sacrificial seed material 25. In embodiments, the sacrificial seed material 25 is etched through the vent hole 80 using any suitable etch process. For example, when the sacrificial seed material 25 comprises Ni, a hydrochloric acid (HCl) wet etch may be performed through the vent hole 80 to selectively remove the Ni without removing the graphene 30. In this manner, an air gap 85 is formed between the graphene 30 and the mandrel 20a/20b.

Figure 15:
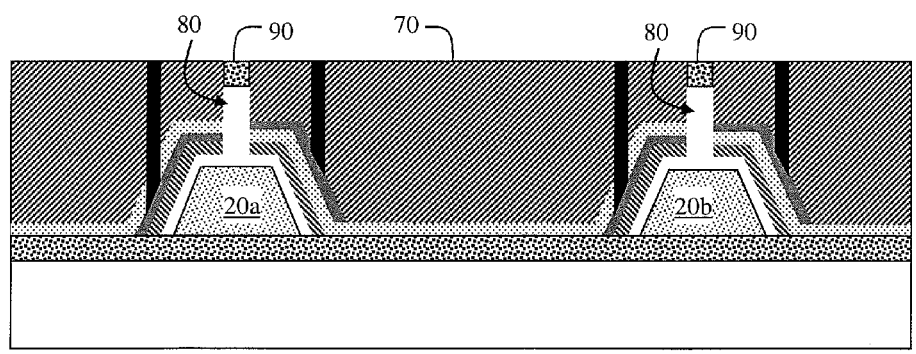

As shown in FIG. 15, the vent holes 80 are plugged with an insulator material 90. In embodiments, a layer of the insulator material 90 is formed on the insulator layer 70 and in the vent holes 80. The layer of the insulator material 90 may be formed using conventional processes, such as CVD. The insulator material 90 is then removed from the top surface of the insulator layer 70, e.g., by CMP or an etch-back process, leaving the insulator material 90 in the vent holes 80. The insulator material 90 may comprise any suitable material, and in embodiments is the same as insulator layer 15, e.g., SiN.

Figure 16:
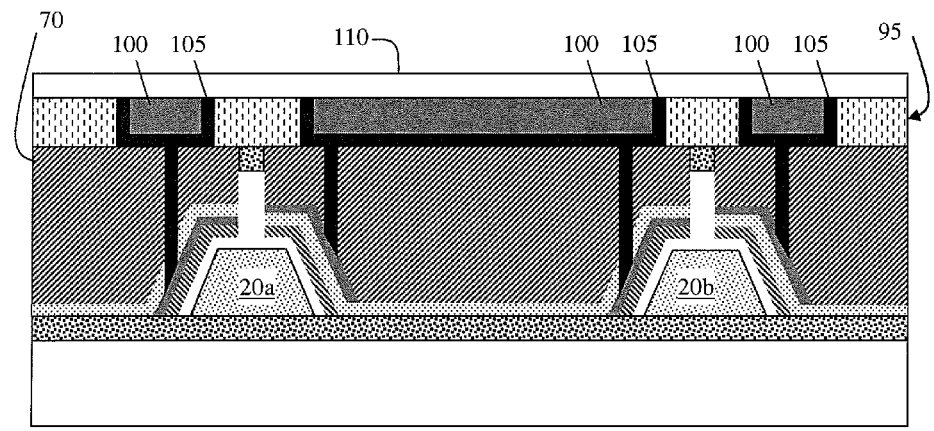

FIG. 16 shows additional processing of the semiconductor structure, including forming a wiring layer 95, one or more wires/interconnects 100 with optional liner 105, and a barrier layer 110, all of which may be formed using conventional materials and semiconductor manufacturing processes. For example, the wiring layer 95 may comprise any suitable insulator material, such as SiCOH formed by CVD on the insulator layer 70. Trenches may be formed in the wiring layer 95 by lithographic patterning and etching processes. Liner 105 may comprise any suitable barrier material, such as TaN/Ta formed by CVD in the trenches. Wires/interconnects 100 may comprise any suitable conductive material, such as Cu, Al, etc., formed by CVD on the liner 105 in the trenches. Barrier layer 110 may comprise any suitable barrier material, such as SiCN formed by CVD over the entire structure. One or more polish steps, e.g., CMP, may be employed during the fabrication of the wiring layer 95, wires/interconnects 100, liner 105, and barrier layer 110.

Figure 17:
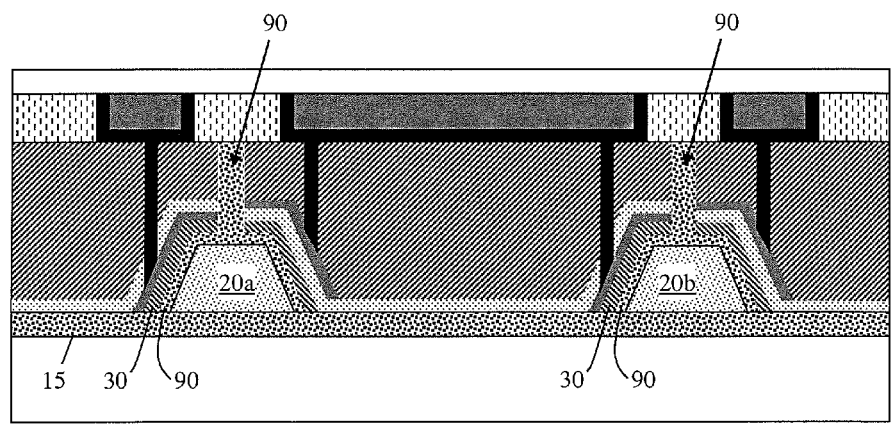

FIG. 17 shows a structure similar to that of FIG. 16 but with an optional filling of the air gap between the graphene 30 and the mandrels 20a and 20b. Referring back to FIGS. 14 and 15, instead of plugging only a top portion of the vent holes, e.g., as shown at FIG. 15, the insulator material 90 may be formed in substantially the entire air gap 85 between the graphene 30 and the mandrels 20a and 20b. Forming the insulator material 90 below the graphene 30 provides structural support and electrical isolation.

Figure 18:
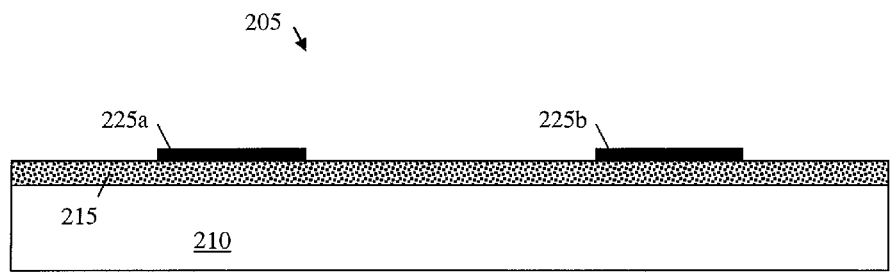
FIGS. 18-35 show processing steps and structures in accordance with additional aspects of the invention.

FIGS. 18-35 show processing steps and structures in accordance with additional aspects of the invention. In particular, FIG. 18 shows a cross section of a portion of a semiconductor structure 205 that has undergone CMOS processing. The semiconductor structure 205 may comprise a substrate 210 and an insulator layer 215, which may be similar to substrate 10 and insulator layer 15 already described herein. For example, the insulator layer 215 may comprise SiN formed on the substrate 210.

Still referring to FIG. 18, respective layers of sacrificial seed material 225a and 225b are formed on the insulator layer 215. According to aspects of the invention, the sacrificial seed material 225a and 225b is used as a seed material for forming graphene. In embodiments, the sacrificial seed material 225a and 225b comprises a layer of Ni (nickel) that is about 10 nm to about 500 nm thick and is formed using a sputtering process, although other suitable materials, thicknesses, and/or deposition processes may be used within the scope of the invention. Optionally, an additional adhesion layer (also represented at reference numbers 225a/225b) may be formed between the insulator layer 215 and the sacrificial seed material 225a and 225b. The adhesion layer may comprise TiN and have a thickness of about 10 nm to about 50 nm, although other materials and/or thicknesses may be used within the scope of the invention.

The sacrificial seed material 225a and 225b may be formed in any suitable manner. For example, in a manner similar to that described with respect to FIG. 3, a layer of sacrificial seed material may be conformally deposited on the top surface of the insulator layer 215, e.g., using CVD, and then patterned in any desired manner, e.g., using photolithographic masking and etching. Two islands of sacrificial seed material 225a and 225b are depicted in FIG. 18; however, the invention is not limited to two islands, and one island or more than two islands may be formed within the scope of the invention. Each respective island of sacrificial seed material 225a and 225b forms the basis for a respective graphene FET, as will be apparent based on the following description.

According to aspects of the invention, the sacrificial seed material 225a and 225b is formed on the substantially planar and substantially horizontal upper surface of the insulator layer 215. As such, islands of the sacrificial seed material 225a and 225b may be used to form a planar graphene FET, e.g., a substantially horizontally oriented FET, as opposed to the vertically oriented graphene FET, e.g., as described with respect to FIGS. 1-17.

Figure 19:
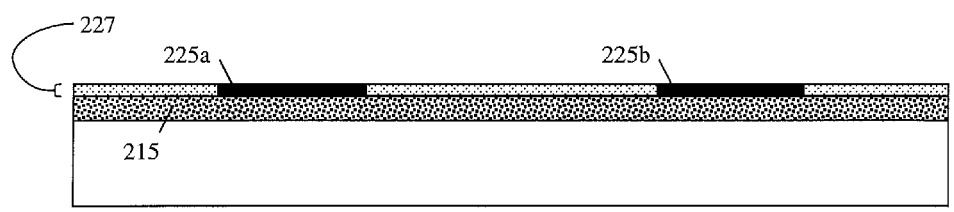

As shown in FIG. 19, a second insulator layer 227 is formed on the insulator layer 215 and around the sacrificial seed material 225a and 225b. In embodiments, the second insulator layer 227 comprises $SiO_2$ formed using CVD and which is planarized, e.g., using CMP, to the top surface of the sacrificial seed material 225a and 225b, although other suitable dielectric materials and formation processes may be used for the second insulator layer 227.

Figure 20:
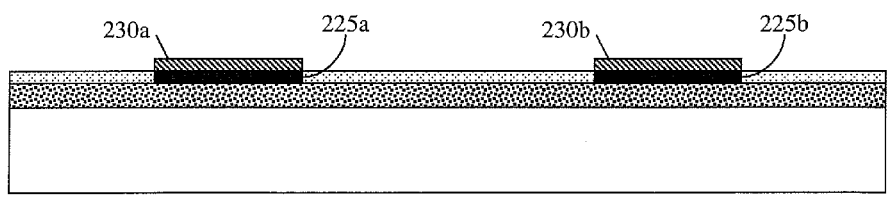

FIG. 20 shows the formation of graphene 230a and 230b on the sacrificial seed material 225a and 225b. In embodiments, the sacrificial seed material 225a and 225b comprises Ni and the graphene 230a and 230b is grown with a CVD process. For example, a single layer of graphene may be formed on Ni using a CVD process with a flow of methane ($CH_4$), argon (Ar), and hydrogen ($H_2$) gases at temperatures from about 900° C. to about 1000° C. for growth times of about 50 s to about 120 s, and post-growth cooling with a flow of Ar and $H_2$ at a cooling rate in a range of about 7° C./min to about 25° C./min. It is to be understood, however, that any suitable method may be used to form the graphene 230a and 230b on the sacrificial seed material 225a and 225b.

Figure 21:
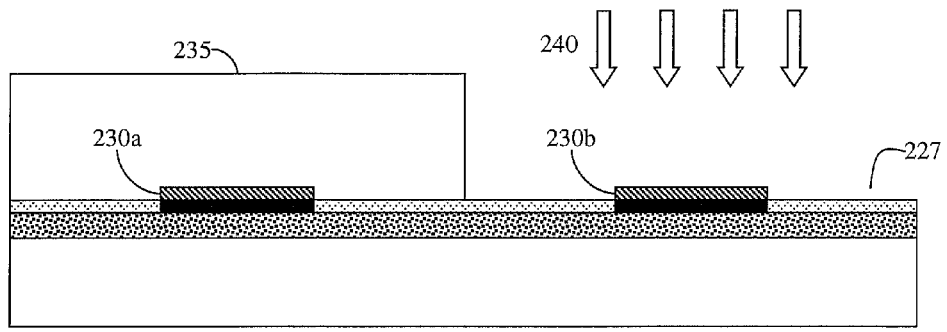
Figure 22:
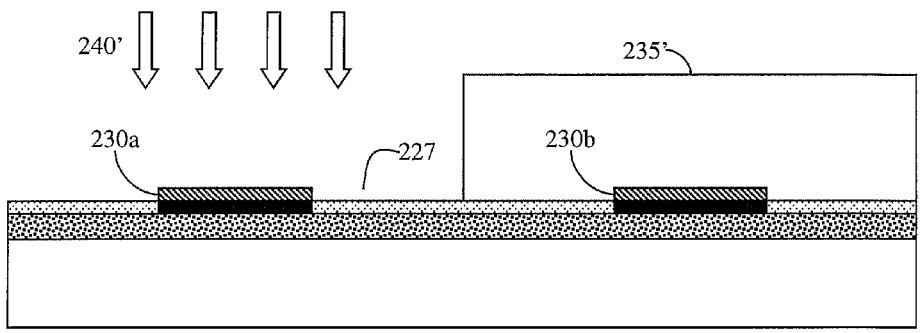

FIGS. 21 and 22 show optional doping of respective portions of the graphene 230a and 230b. For example, as shown in FIG. 21, a mask 235 may be formed over the graphene 230a, leaving the other graphene 230b exposed. The mask 235 may comprise a photomask or hard mask formed using conventional semiconductor processing techniques, e.g., photolithography. After forming the mask 235, the graphene 230b may be doped with n-type or p-type dopant using any suitable doping technique, represented by arrows 240. For example, for n-type doping, the graphene 230b may be chemically doped by exposure to a solution containing poyethylene imine (PEI) for a sufficient amount of time to permit PEI molecules to adsorb into the graphene 230b. Alternatively, for p-type doping, the graphene 230b may be chemically doped by exposure to diazonium salts that bind to the graphene surface. The mask 235 is removed after doping the graphene 230b.

FIG. 22 shows forming a second mask 235' over the graphene 230b, leaving the graphene 230a exposed. A second doping depicted by arrows 240' may be performed in a manner similar to that described above with respect to FIG. 21. The mask 235' is removed after the second doping. For example, FIG. 21 may represent an n-type doping of the graphene 230b and FIG. 22 may represent a p-type doping of the graphene 230a or vice versa. In embodiments, the graphene, e.g., 230a or 230b, functions as a source, drain, and channel of a transistor, and any suitable doping of the graphene can be provided to attain desired characteristics of the source, drain, and channel regions.

Figure 23:
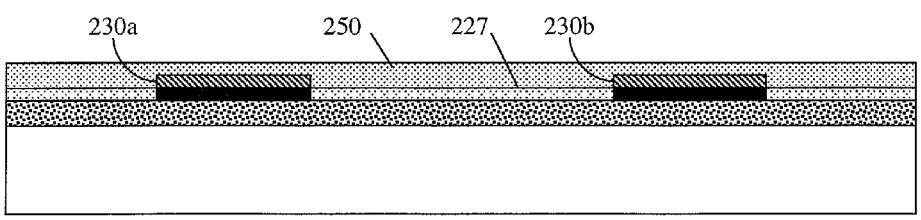

As shown in FIG. 23, a gate dielectric 250 is formed on the graphene 230a and 230b, and also on the second insulator layer 227. The gate dielectric 250 may comprise any suitable material including, but not limited to, $Al_2O_3$, $HfO_2$, SiN, polymer, and combinations thereof. The gate dielectric 250 may be formed using conventional semiconductor processing techniques including, but not limited to, atomic layer deposition (ALD), e.g., for $Al_2O_3$ and/or $HfO_2$, plasma enhanced chemical vapor deposition (PECVD), e.g., for SiN, and spin-coating, e.g., for polymers. The gate dielectric 250 may have a physical thickness of about 10 nm to about 20 nm, although other thicknesses, materials, and/or formation processes may be used within the scope of the invention.

Figure 24:
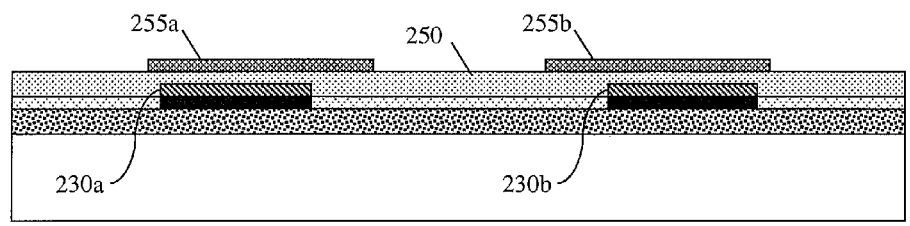
Figure 25:
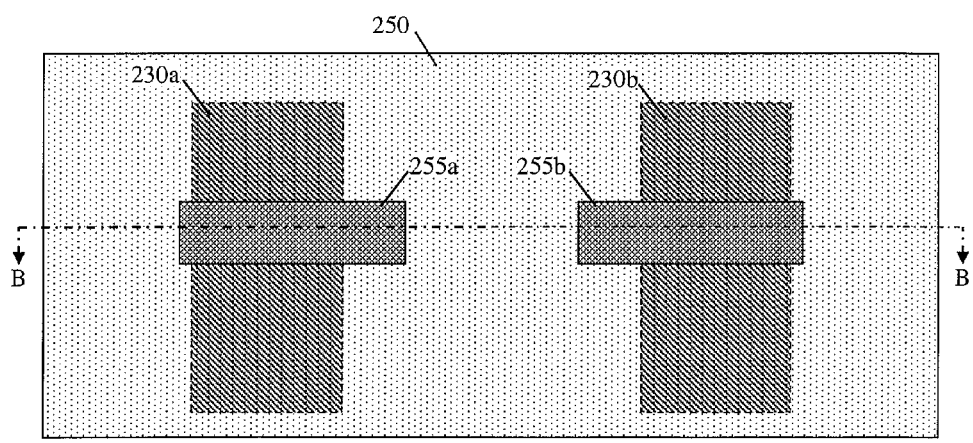

FIGS. 24 and 25 depict the formation of gate electrodes 255a and 255b on the gate dielectric 250 and over the graphene 230a and 230b. FIG. 25 is a top down view of the semiconductor structure, and FIG. 24 is a cutaway view taken along line B-B of FIG. 25. The gate electrodes 255a and 255b are electrically conductive and may be composed of any suitable material or combination of materials. For example, each gate electrode 255a and 255b may comprise platinum (Pt), aluminum (Al), titanium (Ti), and/or gold (Au). The gate electrodes 255a and 255b may be formed using conventional semiconductor processing techniques, such as electron beam evaporation combined with a lift-off process. The gate electrodes 255a and 255b are not limited to the materials and processes described herein, and other materials and/or formation processes may be used within the scope of the invention.

Figure 26:
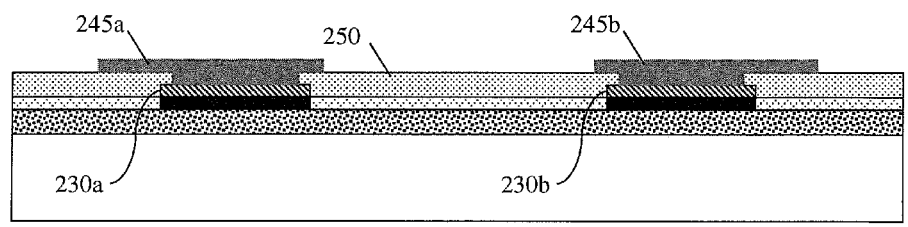
Figure 27:
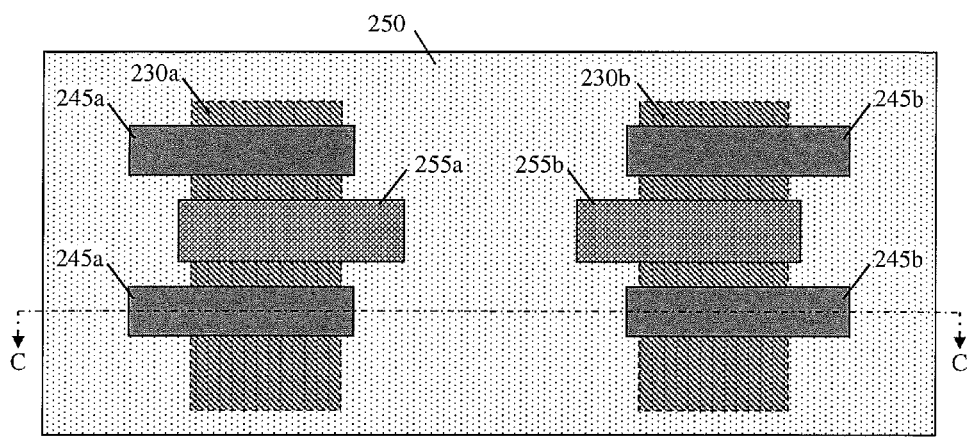

FIGS. 26 and 27 depict the formation of source/drain electrodes 245a and 245b on portions of the gate dielectric 250 and on portions of the graphene 230a and 230b. FIG. 27 is a top down view of the semiconductor structure, and FIG. 26 is a cutaway view taken along line C-C of FIG. 27. The source/drain electrodes 245a and 245b are electrically conductive and may be composed of any suitable material or combination of materials. For example, each source/drain electrode 245a and 245b may comprise a layer of palladium (Pd) having a thickness of about 20 nm and a layer of gold (Au) having a thickness of about 40 nm. As another example, each source/drain electrode 245a and 245b may comprise a layer of titanium (Ti) having a thickness of about 20 nm and a layer of gold (Au) or platinum (Pt) having a thickness of about 50 nm.

The source/drain electrodes 245a and 245b may be formed using conventional semiconductor processing techniques, such as electron beam evaporation combined with a lift-off process. It is to be understood that other materials, thicknesses, and/or deposition processes may be used for the source/drain electrodes 245a and 245b. Since the source/drain electrodes 245a and 245b are in direct physical contact with the graphene 230a and 230b, an opening is formed in the gate dielectric 250 for each respective source/drain electrode 245a and 245b prior to depositing the material that forms the source/drain electrodes. These openings may be formed in any suitable manner, such as photolithographic masking and etching of the gate dielectric 250 to expose portions of the graphene 230a and 230b.

Figure 28:
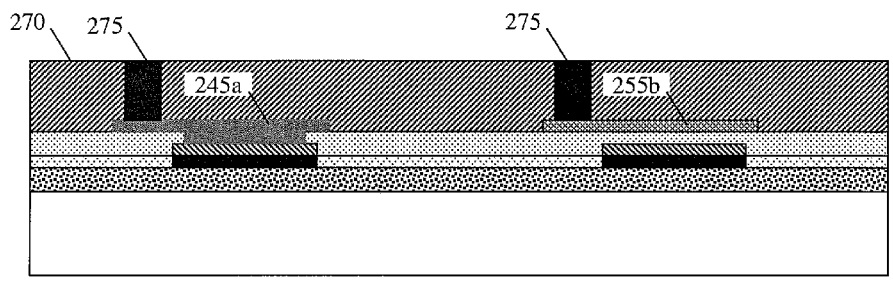
Figure 29:
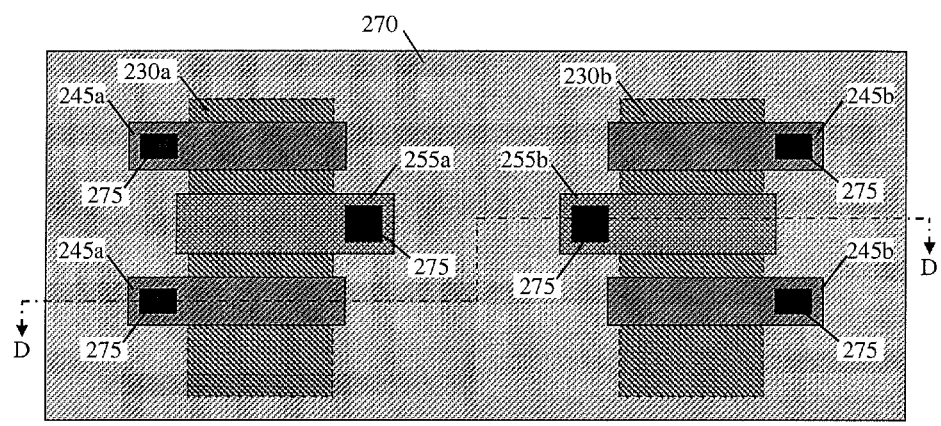

As shown in FIGS. 28 and 29, an insulator layer 270 is formed over the entire structure, and conductive contacts 275 are formed in the insulator layer 270 and on the source/drain electrodes 245a, 245b and gate electrodes 255a, 255b. FIG. 29 is a top down view of the semiconductor structure, and FIG. 28 is a cutaway view taken along line D-D of FIG. 29. In FIG. 29, the insulator layer 270 is shown as semi-transparent in order to illustrate other features below the insulator layer 270. The insulator layer 270 and contacts 275 may be formed in a manner similar to insulator layer 70 and electrical contacts 75 described with respect to FIGS. 11 and 12. For example, the insulator layer 270 may comprise any suitable electrical insulator material, such as, for example, borophosphosilicate glass (BPSG), tetraethylorthosilicate (TEOS), phosphosilicate glass (PSG), etc., and may be formed using conventional semiconductor manufacturing processes, such as CVD. After forming the insulator layer 270, the contacts 275 are formed in the insulator layer 270 and contacting the source/drain electrodes 245a, 245b and gate electrodes 255a, 255b. The contacts 275 may be any suitable electrically conductive material including, but not limited to, tungsten (W). The contacts 275 may be formed using conventional processing techniques, such as masking the insulator layer 270, etching patterns in the insulator layer 270, filling the patterns with the electrically conductive material, and planarizing the top surface.

Figure 30:
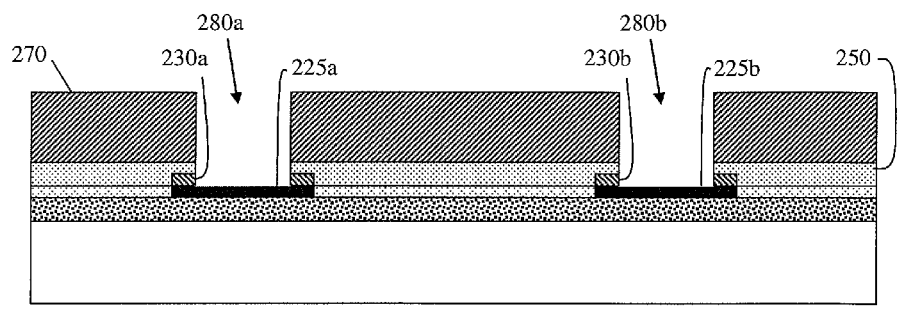
Figure 31:
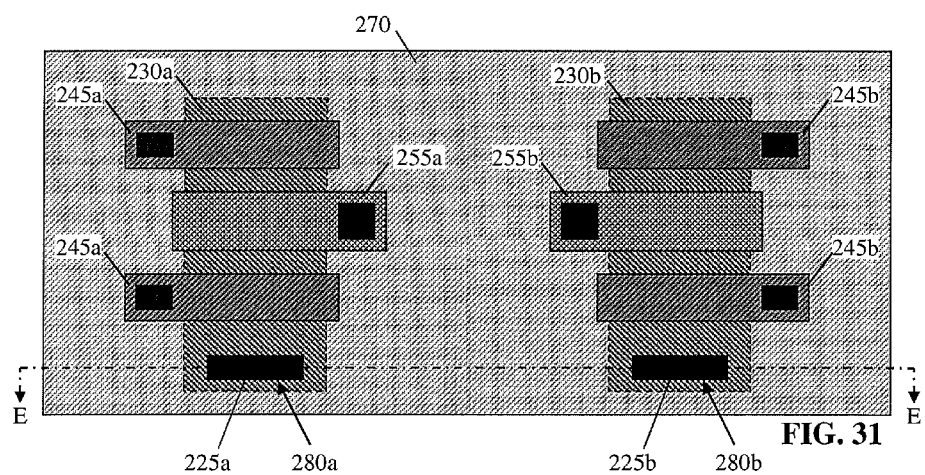

FIGS. 30 and 31 show the formation of vent holes 280a and 280b in accordance with aspects of the invention. FIG. 31 is a top down view of the semiconductor structure, and FIG. 30 is a cutaway view taken along line E-E of FIG. 31. In FIG. 31, the insulator layer 270 is shown as semi-transparent in order to illustrate other features below the insulator layer 270. In embodiments, the respective vent holes 280a and 280b are formed through the insulator layer 270, the gate dielectric 250, and the respective graphene 230a and 230b. The vent holes 280a and 280b may be formed using conventional lithographic masking and etching processes, and may have any suitable size and shape. By extending completely through a depth of the graphene 230a and 230b, the vent holes 280a and 280b expose portions of the sacrificial seed material 225a and 225b. In this manner, the sacrificial seed material 225a and 225b may be removed via an etching process that is performed through the vent holes 280a and 280b, as described in greater detail herein.

Figure 32:
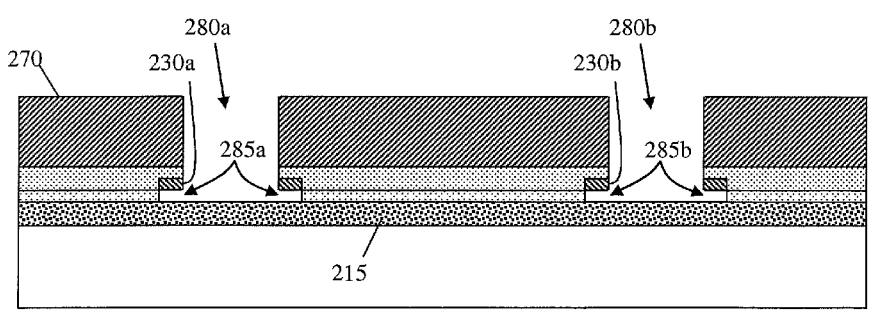

FIG. 32 shows the removal of the sacrificial seed material 225a and 225b. In embodiments, the sacrificial seed material 225a and 225b is etched through the vent holes 280a and 280b using any suitable etch process. For example, when the sacrificial seed material 225a and 225b comprises Ni, a hydrochloric acid (HCl) wet etch may be performed through the vent holes 280a and 280b to selectively remove the Ni without removing the graphene 230a and 230b. In this manner, respective gaps 285a and 285b are formed between the respective graphene 230a, 230b and the insulator layer 215.

Figure 33:
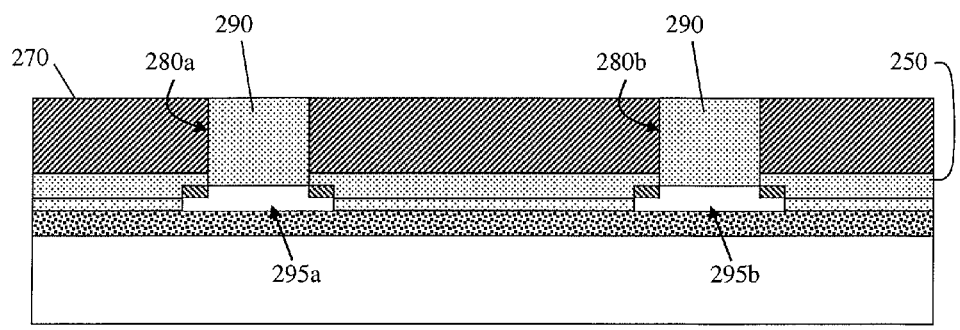

As shown in FIG. 33, the vent holes 280a, 280b are plugged with an insulator material 290. In embodiments, a layer of the insulator material 290 is formed on the insulator layer 270 and in the vent holes 280a, 280b. The layer of the insulator material 290 may be formed using conventional processes, such as CVD. The insulator material 290 is then removed from the top surface of the insulator layer 270, e.g., by CMP or an etch-back process, leaving the insulator material 290 in the vent holes 280a, 280b. The insulator material 290 may comprise any suitable material, and in embodiments is the same as the gate dielectric 250. Plugging the vent holes 280a, 280b with the insulator material 290 creates sealed air gaps 295a and 295b.

Figure 34:
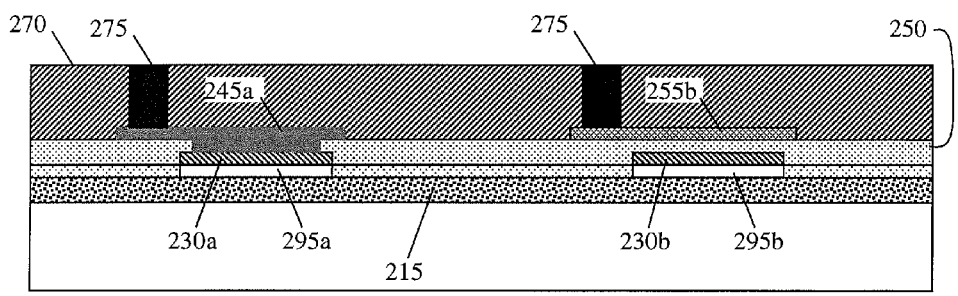
Figure 35:
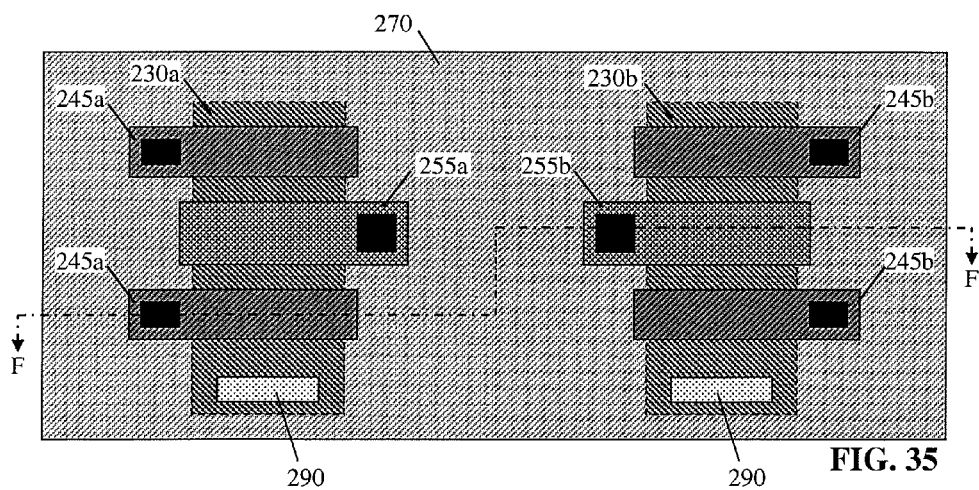

FIGS. 34 and 35 show corresponding views of the structure after removing the sacrificial seed material and plugging the vent holes with insulator material 290. FIG. 35 is a top down view of the semiconductor structure, and FIG. 34 is a cutaway view taken along line F-F of FIG. 35. In FIG. 35, the insulator layer 270 is shown as semi-transparent in order to illustrate other features below the insulator layer 270. As depicted in FIG. 34, the respective sealed air gaps 295a, 295b extend under the respective graphene 230a, 230b, e.g., between the insulator layer 215 and the graphene 230a, 230b. In embodiments, since the graphene 230a, 230b is initially formed on the seed material, and since the entirety of the seed material is removed, it follows that the sealed air gaps 295a, 295b extend under substantially all of the graphene 230a, 230b. The graphene 230a provides a conductive channel between source/drain electrodes 245a and underneath gate electrode 255a and gate dielectric 250. Similarly, the graphene 230b provides a conductive channel between source/drain electrodes 245b and underneath gate electrode 255b and gate dielectric 250. In this manner, implementations of the invention may be used to provide planar graphene FETs with mechanical support. Additional processing of the semiconductor structure, such as that described with respect to FIG. 16, may also be performed.

Figure 36:
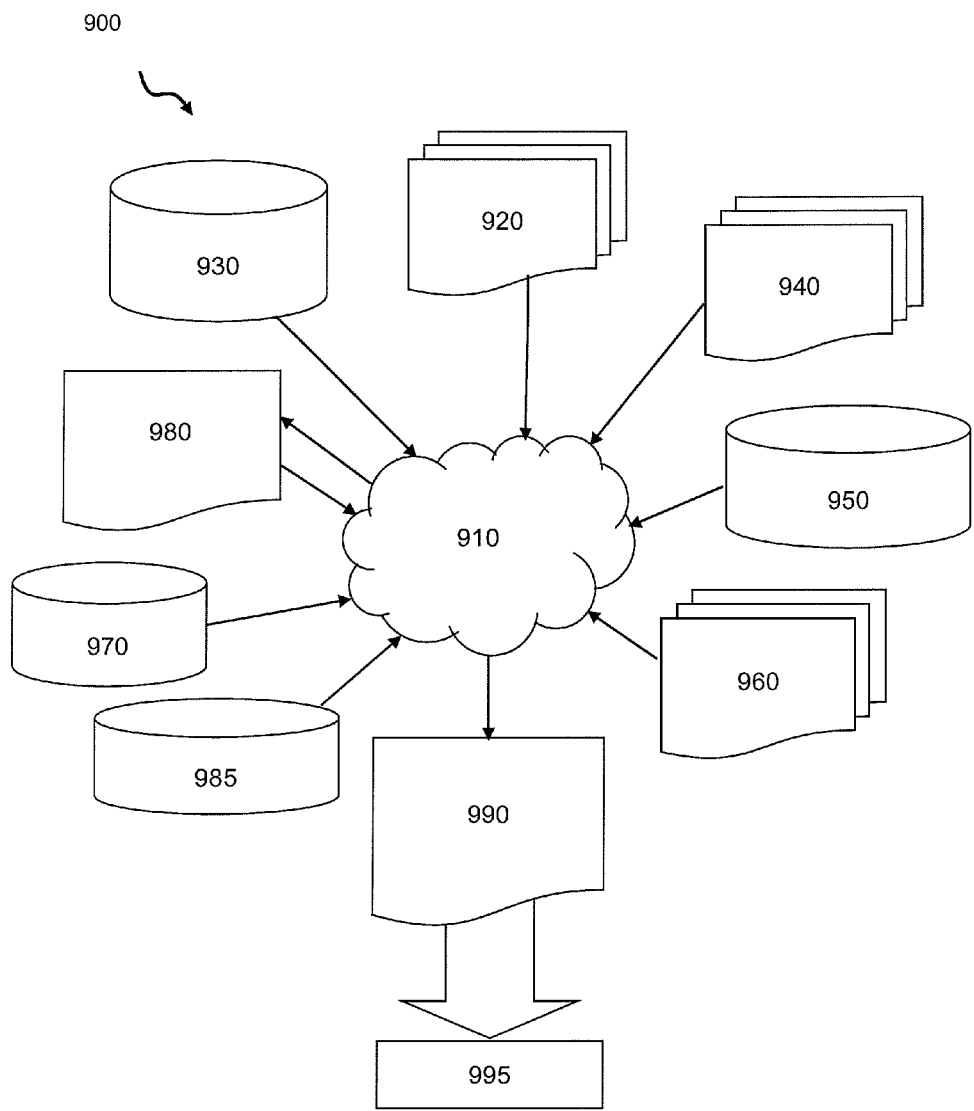
FIG. 36 is a flow diagram of a design process used in semiconductor design, manufacture, and/or test.

FIG. 36 is a flow diagram of a design process used in semiconductor design, manufacture, and/or test. FIG. 36 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-35. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 36 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-35. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-35 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-35. In one embodiment, design structure 990 may comprise a compiled, executable HDL simulation model that functionally simulates the devices shown in FIGS. 1-35.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-35. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims, if applicable, are intended to include any structure, material, or act for performing the function in combination with other claimed elements as specifically claimed. Moreover, while the invention has been described in terms of embodiments, those of ordinary skill in the art will recognize that the invention can be practiced with modifications and in the spirit and scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method of manufacturing a semiconductor structure, comprising:
    forming a seed material on an insulator layer;
    forming a second insulator layer on the insulator layer and around the seed material;
    forming a graphene field effect transistor (FET) on the seed material; and
    forming an air gap under the graphene FET by removing the seed material,
    wherein the forming the graphene FET on the seed material is performed prior to the forming the air gap under the graphene FET.

2. The method of claim 1, wherein the forming the graphene FET comprises forming a graphene layer on the seed material.

3. The method of claim 2, wherein the forming the graphene FET comprises forming a gate dielectric on the graphene layer.

4. The method of claim 3, wherein the forming the graphene FET comprises forming a gate electrode, a source electrode, and a drain electrode on the gate dielectric.

5. The method of claim 2, wherein the seed material comprises nickel and the forming the graphene layer comprises a chemical vapor deposition on the nickel.

6. The method of claim 2, further comprising doping the graphene layer with one of n-type and p-type doping.

7. The method of claim 1, further comprising forming an other insulator material over the graphene FET.

8. A method of manufacturing a semiconductor structure, comprising:
    forming a seed material on an insulator layer;
    forming a graphene field effect transistor (FET) on the seed material;
    forming an air gap under the graphene FET by removing the seed material; and
    forming an other insulator material over the graphene FET,
    wherein the removing the seed material comprises forming a vent hole through the other insulator material, the gate dielectric, and the graphene.

9. The method of claim 8, wherein the removing the seed material comprises etching the seed material through the vent hole.

10. The method of claim 8, further comprising plugging the vent hole.

11. The method of claim 8, wherein the removing the seed material forms an air gap between a graphene layer of the graphene FET and the insulator layer.

12. The method of claim 1, wherein the graphene FET is a planar FET.

13. The method of claim 1, wherein:
    the insulator layer has a substantially planar and substantially horizontal top surface; and
    the forming the seed material comprises forming a layer of the seed material on the substantially planar and substantially horizontal top surface.

14. A method of manufacturing a semiconductor structure, comprising:
    forming an insulator layer on a substrate;
    forming a seed material on the insulator layer;
    forming a graphene layer on the seed material;
    forming a gate dielectric on the graphene layer;
    forming a source electrode and a drain electrode on the graphene layer;
    forming a gate electrode on the gate dielectric and between the source electrode and the drain electrode;
    forming an upper insulator layer on the gate electrode, the source electrode, and the drain electrode;
    exposing a portion of the seed material by forming a vent hole in the upper insulator layer and the graphene layer;
    removing the seed material through the vent hole; and
    plugging the vent hole.

15. The method of claim 14, wherein the graphene layer provides a source, a drain, and a channel region of a field effect transistor (FET).

16. The method of claim 15, wherein the FET is a planar FET.

17. The method of claim 3, wherein the forming the gate dielectric comprises forming the gate dielectric on both an upper surface of the graphene layer and an upper surface of the second insulator layer.

18. The method of claim 4, wherein the forming the source electrode and the drain electrode comprises:
    forming respective openings in the gate dielectric to expose respective portions of the graphene layer; and
    forming the source electrode and the drain electrode in the respective openings on the exposed respective portions of the graphene layer.

19. The method of claim 2, further comprising patterning the seed material prior to the forming the graphene layer on the seed material.

* * * * *